United States Patent
Goel et al.

(10) Patent No.: US 11,113,444 B2
(45) Date of Patent: Sep. 7, 2021

(54) MACHINE-LEARNING BASED SCAN DESIGN ENABLEMENT PLATFORM

(71) Applicant: Taiwan Semiconductor Manufacturing Co., Ltd., Hsinchu (TW)

(72) Inventors: Sandeep Kumar Goel, Dublin, CA (US); Yun-Han Lee, Hsinchu County (TW); Vinay Kotha, San Jose, CA (US); Ankita Patidar, Dublin, CA (US)

(73) Assignee: Taiwan Semiconductor Manufacturing Co., Ltd.

( * ) Notice: Subject to any disclaimer, the term of this patent is extended or adjusted under 35 U.S.C. 154(b) by 88 days.

(21) Appl. No.: 16/173,448

(22) Filed: Oct. 29, 2018

(65) Prior Publication Data

US 2020/0004913 A1    Jan. 2, 2020

Related U.S. Application Data

(60) Provisional application No. 62/690,601, filed on Jun. 27, 2018.

(51) Int. Cl.
*G06F 30/394* (2020.01)
*G06F 17/18* (2006.01)
(Continued)

(52) U.S. Cl.
CPC .......... *G06F 30/394* (2020.01); *G06F 17/18* (2013.01); *G06F 30/398* (2020.01); *G06N 20/00* (2019.01)

(58) Field of Classification Search
CPC ...... G06F 30/394; G06F 30/398; G06F 17/18; G06N 20/00

(Continued)

(56) References Cited

U.S. PATENT DOCUMENTS 5,983,376 A * 11/1999 Narayanan ..... G01R 31/318583
714/726
6,282,506 B1 * 8/2001 Takeoka ......... G01R 31/318586
703/27

(Continued)

FOREIGN PATENT DOCUMENTS

JP    2005276069 A    10/2005
JP    2006163688 A    6/2006

(Continued)

OTHER PUBLICATIONS

Notice of Allowance, dated Dec. 14, 2020, for Korean Intellectual Property Office Appl. No. 10-2019-0075026, 7 pages.

*Primary Examiner* — Suresh Memula
(74) *Attorney, Agent, or Firm* — Sterne, Kessler, Goldstein & Fox P.L.L.C.

(57) ABSTRACT

Electronic design automation (EDA) of the present disclosure, in various embodiments, optimizes designing, simulating, analyzing, and verifying of electronic circuitry for an electronic device. The electronic device includes scan flip-flops to autonomously test the electronic circuitry for various manufacturing faults. The EDA of the present disclosure statistically groups the scan flip-flops into scan chains in such a manner such that scan flip-flops within each scan chain share similar characteristics, parameters, or attributes. Thereafter, the EDA of the present disclosure intelligently arranges ordering for the scan flip-flops within each of the scan chains to optimize power, performance, and/or area of the electronic circuitry.

19 Claims, 5 Drawing Sheets

(51) Int. Cl.
*G06N 20/00* (2019.01)
*G06F 30/398* (2020.01)

(58) Field of Classification Search
USPC .......................................................... 716/126
See application file for complete search history.

(56) References Cited

U.S. PATENT DOCUMENTS

| | | | | |
|---|---|---|---|---|
| 6,305,004 B1* | 10/2001 | Tellez | ................... | G06F 30/394 716/129 |
| 2002/0004929 A1* | 1/2002 | Osaki | ................ | H01L 27/11898 716/122 |
| 2002/0029361 A1* | 3/2002 | Kasahara | .............. | G06F 30/327 714/726 |
| 2002/0107711 A1* | 8/2002 | Xing | ..................... | G06F 30/394 716/130 |
| 2005/0273683 A1* | 12/2005 | Cote | ............. | G01R 31/318583 714/726 |
| 2006/0242515 A1* | 10/2006 | Alvamani | ...... | G01R 31/318547 714/729 |
| 2006/0282727 A1* | 12/2006 | Hoshaku | ........ | G01R 31/318594 714/726 |
| 2009/0032899 A1* | 2/2009 | Irie | ......................... | G06F 30/35 257/499 |
| 2009/0174451 A1* | 7/2009 | Pasqualini | ..... | G01R 31/318536 327/199 |
| 2010/0079168 A1* | 4/2010 | Tashiro | .......... | G01R 31/318538 326/93 |
| 2010/0169727 A1 | 7/2010 | Ito et al. | | |
| 2012/0221284 A1* | 8/2012 | Sinanoglu | .......... | G01R 31/3177 702/119 |
| 2013/0069169 A1* | 3/2013 | Kwon | ............... | H01L 27/11807 257/401 |
| 2015/0188545 A1* | 7/2015 | Gupta | ................ | H03K 19/1736 327/211 |
| 2017/0323030 A1* | 11/2017 | Datta | ..................... | G06F 30/34 |

FOREIGN PATENT DOCUMENTS

| | | |
|---|---|---|
| JP | 2010157009 A | 7/2010 |
| JP | 2017106826 A | 6/2017 |
| TW | 200502805 A | 1/2005 |

* cited by examiner

MACHINE-LEARNING BASED SCAN DESIGN ENABLEMENT PLATFORM

CROSS-REFERENCE TO RELATED APPLICATIONS

The present application claims the benefit of U.S. Provisional Patent Appl. No. 62/690,601, filed Jun. 27, 2018, which is incorporated herein by reference in its entirety.

BACKGROUND

Advances in technology and engineering have allowed designers and manufacturers to offer more electronic devices to consumers. Scan chain testing represents a design for testability (DFT) mechanism for detecting faults within various combinational logic circuits of these electronic devices. Scan chain testing involves grouping of numerous scan flip-flops into numerous scan chains and placing these numerous scan chains into the electronic devices for detecting the faults. In some situations, the scan chains conventionally occupy between 10 to 40 percent of the real estate area dedicated these electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Overview

Electronic design automation (EDA) of the present disclosure, in various embodiments, optimizes designing, simulating, analyzing, and verifying of electronic circuitry for an electronic device. The electronic device includes scan flip-flops to autonomously test the electronic circuitry for various manufacturing faults. The EDA of the present disclosure statistically groups the scan flip-flops into scan chains in such a manner such that scan flip-flops within each scan chain share similar characteristics, parameters, or attributes. Thereafter, the EDA of the present disclosure intelligently arranges ordering for the scan flip-flops within each of the scan chains to optimize power, performance, and/or area of the electronic circuitry.

Exemplary Electronic Design Platform

Figure 1:
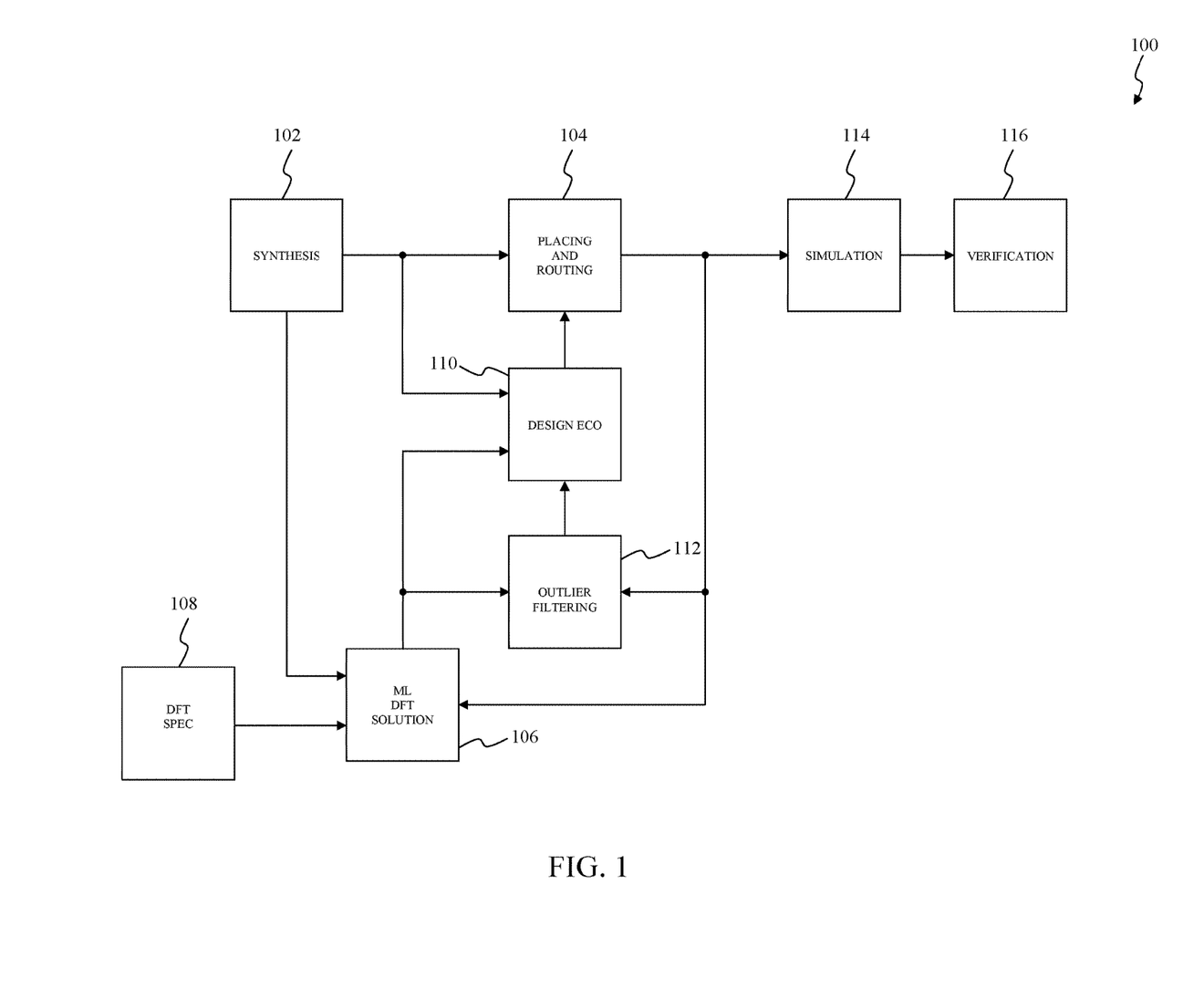
FIG. 1 illustrates a block diagram of an electronic design platform of the exemplary design environment according to an exemplary embodiment of the present disclosure.

FIG. 1 illustrates a block diagram of an electronic design platform of the exemplary design environment according to an exemplary embodiment of the present disclosure. As illustrated in FIG. 1, the electronic design platform 100 represents a design flow including one or more electronic design software tools for designing, simulating, analyzing, and/or verifying one or more electronic architectural design layouts for electronic circuitry of an electronic device. In the exemplary embodiment illustrated in FIG. 1, the electronic device includes one or more scan chains for testing the electronic circuitry for various manufacturing faults, such as stuck-at faults to provide an example. The one or more electronic architectural design layouts represent one or more images and/or one or more data-based representations of geometric shapes describing the electronic circuitry, locations of the geometric shapes, and/or interconnections between the geometric shapes. As to be discussed in further detail below, the electronic design platform 100 performs an iterative sequence of operations to optimize placement of the one or more scan chains within the one or more electronic architectural design layouts to conserve resources, such as power and/or real estate to provide some examples, of the electronic device. In some situations, this iterative sequence of operations can itself be iteratively repeated to optimize placement of the one or more scan chains within the one or more electronic architectural design layouts. For example, this iterative sequence of operations can itself be iteratively when the one or more electronic architectural design layouts are irregular.

In the exemplary embodiment illustrated in FIG. 1, the electronic design platform 100 includes a synthesis tool 102, a placing and routing tool 104, a machine learning (ML) design-for-test (DFT) solution tool 106, a DFT specification tool 108, a design engineering change order (ECO) tool 110, an outlier filtering tool 112, a simulation tool 114, and a verification tool 116. These various tools, which to be described in further detail below, represent one or more electronic design software tools, that when executed by one or more computing devices, processors, controllers, or other devices that will be apparent to those skilled in the relevant art(s) without departing from the spirit and scope of the present disclosure, can design, simulate, analyze, and/or verify one or more electronic architectural design layouts. Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The synthesis tool 102 translates one or more characteristics, parameters, or attributes of the electronic circuitry into one or more logic operations, one or more arithmetic operations, one or more control operations, and/or any other suitable operations that will be apparent to those skilled in the relevant art(s) without departing from the spirit and scope of the present disclosure into one or more high-level software level descriptions of the electronic circuitry. In an exemplary embodiment, the one or more high-level software level descriptions can represent a textual representation of the electronic circuitry, such as a netlist; a high-level software model of the electronic circuitry using a high-level software language, such as a graphical design tool, for example C, System C, C++, LabVIEW, and/or MATLAB, a general purpose system design language, such as like SysML, SMDL and/or SSDL, or a high-level software format, such as Common Power Format (CPF), Unified Power Formant (UPF); or an image-based representation of the electronic circuitry, such as a computer-aided design (CAD) model to provide an example. In the exemplary embodiment illustrated in FIG. 1, the synthesis tool 102 can generate a scan chain report, such as a text file to provide an example, describing the scan chains for testing the electronic circuitry for various manufacturing faults, such as stuck-at faults to provide an example. In this exemplary embodiment, the scan chain report represents an accounting of the number of scan chains within the electronic circuitry, a cumulative number of scan flip-flops within each of the scan chains, and/or a cumulative number of scan flip-flops within the electronic circuitry in its entirety.

The placing and routing tool 104 defines the one or more logic operations, the one or more arithmetic operations, the one or more control operations, and/or the other suitable operation from the synthesis tool 102 in terms of various geometric shapes which correspond to diffusion layers, polysilicon layers, and/or metal layers, as well as interconnections between these layers to provide the one or more electronic architectural design layouts. The placing and routing tool 104 logically places various electrical, mechanical, and/or electro-mechanical components of the electronic circuitry as described by the one or more high-level software level descriptions of the electronic circuitry onto an electronic design real estate to provide one or more electronic architectural design placements for the electronic circuitry. Thereafter, the placing and routing tool 104 assigns geometric shapes to the various electrical, mechanical, and/or electro-mechanical components of the electronic circuitry, assigns locations for the geometric shapes within the electronic design real estate, and/or routes interconnections between the geometric shapes to provide the one or more electronic architectural design layouts. In an exemplary embodiment, the placing and routing tool 104 utilizes a textual or an image-based netlist describing the electronic circuitry, a technology library for manufacturing the electronic device, a semiconductor foundry for manufacturing the electronic device, and/or a semiconductor technology node for manufacturing the electronic device to place the various electrical, mechanical, and/or electro-mechanical components, to assign the geometric shapes to the various electrical, mechanical, and/or electro-mechanical components of the electronic circuitry, to assign locations for the geometric shapes within the electronic design real estate, and/or to route the interconnections between the geometric shapes.

The machine learning (ML) design-for-test (DFT) solution tool 106 groups and orders the scan flip-flops within the scan chains. The ML DFT solution tool 106 receives the scan chain report describing the scan chains from the synthesis tool 102 and the one or more electronic architectural design placements and/or the one or more electronic architectural design layouts from the placing and routing tool 104. The ML DFT solution tool 106 utilizes the one or more electronic architectural design placements and/or the one or more electronic architectural design layouts to extract locations of the scan flip-flops. The ML DFT solution tool 106 performs a mathematical cluster analysis of the scan flip-flops, such as connectivity-based clustering, also referred to as hierarchical clustering, such as agglomerative clustering to provide an example; centroid-based clustering such as k-means clustering to provide an example, a distribution-based clustering; and/or a density-based clustering to provide some examples. The mathematical cluster analysis groups the scan flip-flops in such a manner such that scan flip-flops within each scan chain share similar characteristics, parameters, or attributes when compared to characteristics, parameters, or attributes of other scan flip-flops within other scan chains. The characteristics, parameters, or attributes can include distances between the scan flip-flops within the scan chains, density of the scan flip-flops within the scan chains, and/or statistical distributions, such as mean distances to provide an example, of the scan flip-flops within the scan chains. In an exemplary embodiment, the number of scan chains and the number of scan flip-flops for each of the scan chains is identified in the scan chain report.

After arranging the scan flip-flops to the scan chains, the ML DFT solution tool 106 performs a mathematical routing analysis, such as a shortest path problem, for example, a travelling salesman problem (TSP), of the scan flip-flops within each of the scan chains to determine a routing order for the scan flip-flops. The mathematical routing analysis iteratively arranges a sequence or ordering for the scan flip-flops within each of the scan chains to optimize one or more routing parameters of the one or more electronic architectural design placements and/or the one or more electronic architectural design layouts, such as wire length to provide an example, to determine the routing order for the scan flip-flops. For example, the mathematical routing analysis can adjust the sequence of a scan chain to be a first sequence of a first scan flip-flop, a second scan flip-flop, and a third scan flip-flop from a second sequence of the first scan flip-flop, the third scan flip-flop, and the second scan flip-flop when the wire length of the first sequence is less than the wire length of the second sequence. The mathematical routing analysis continues to arrange the sequence or ordering for the scan flip-flops until the one or more routing parameters are optimized. In an exemplary embodiment, the ML DFT solution tool 106 provides a scan cluster report representing a textual or an image-based netlist describing the grouping of the scan flip-flops within the scan chains and the routing order for the scan flip-flops within each of the scan chains.

In some situations, the grouping and/or the ordering of the scan flip-flops within the scan chains can be subject to one or more electronic design constraints. In an exemplary embodiment, the one or more electronic design constraints can be outlined in an electronic design specification for the electronic circuitry. The one or more electronic design constraints can specify, for example, a cumulative number of scan flip-flops within one or more of the scan chains, a predetermined grouping of scan flip-flops within one or more of the scan chains, and/or a predetermined routing order for the scan flip-flops within one or more of the scan chains. As illustrated in FIG. 1, the electronic design platform 100 includes the DFT specification tool 108 for receiving these electronic design constraints. In an exemplary embodiment, the DFT specification tool 108 can receive an electronic design constraint report, such as a text file to provide an example, describing the one or more electronic design constraints. However, other mechanisms for receiving the one or more electronic design constraints are possible, such as manual entry via a peripheral device, such as a keyboard, without departing from the spirit and scope of the present disclosure.

The design engineering change order (ECO) tool 110 adjusts the one or more high-level software level descriptions of the electronic circuitry provided by the synthesis tool 102 in accordance with the grouping and the ordering of the scan flip-flops provided by the ML DFT solution tool 106. As described above, the synthesis tool 102 translates the one or more characteristics, parameters, or attributes of the electronic circuitry into the one or more logic operations, the one or more arithmetic operations, the one or more control operations, and/or the other suitable operation into the one or more high-level software level descriptions of the electronic circuitry. In the exemplary embodiment illustrated in FIG. 1, the design ECO tool 110 removes the grouping and ordering of the scan flip-flops from the one or more high-level software level descriptions of the electronic circuitry provided by the synthesis tool 102. Thereafter, in this exemplary embodiment, the design ECO tool 110 augments the one or more high-level software level descriptions of the electronic circuitry with the grouping and ordering of the scan flip-flops provided by the ML DFT solution tool 106. Next, the placing and routing tool 104 augments the one or more electronic architectural design placements and/or the one or more electronic architectural design layouts in accordance with the grouping and ordering of the scan flip-flops provided by the ML DFT solution tool 106 as described by the one or more high-level software level descriptions of the electronic circuitry provided by the design ECO tool 110. In some situations, the grouping and/or the ordering of the scan flip-flops within the scan chains can be subject to the one or more electronic design constraints as described above. In these situations, those scan flip-flops and/or those scan chains having the one or more electronic design constraints can be removed from consideration by the design ECO tool 110. In these situations, the grouping and/or the ordering of those scan flip-flops and/or those scan chains having the one or more electronic design constraints remain as described within the one or more high-level software level descriptions of the electronic circuitry provided by the synthesis tool 102.

The outlier filtering tool 112 performs a statistical cost analysis of the scan flip-flops within the scan chains to identify whether one or more non-optimum, referred to as outlier, scan flip-flops are present the scan chains. In the exemplary embodiment illustrated in FIG. 1, the outlier filtering tool 112 analyzes the one or more electronic architectural design placements and/or the one or more electronic architectural design layouts from the placing and routing tool 104 for one or more characteristics, parameters, or attributes of electrical connections between the scan flip-flops within the scan chains. In an exemplary embodiment, the one or more characteristics, parameters, or attributes can include lengths (L) of scan wires between the scan flip-flops, distances (D) between the scan flip-flops, and number of metal layers (M) needed to manufacture the scan chains. Thereafter, the outlier filtering tool 112 performs the statistical cost analysis of the one or more characteristics, parameters, or attributes, such as a L/D cost analysis, an M/D cost analysis, and/or an M/L cost analysis to provide some examples, to identify one or more non-optimum electrical connections between the scan flip-flops within the scan chains. The outlier filtering tool 112 identifies those electrical connections whose statistical cost analysis are greater than or equal to a cutoff threshold, such as two standard deviations from the mean value of the statistical cost analysis, four standard deviations from the mean value of the statistical cost analysis, and/or six standard deviations from the mean value of the statistical cost analysis to provide some examples, as the non-optimum electrical connections. Next, the outlier filtering tool 112 locates scan flip-flops, referred to as non-optimum scan flip-flops, within the scan chains which correspond, for example, are closest, to these non-optimum electrical connections. Thereafter, the outlier filtering tool 112 adjusts the grouping and/or the ordering of these non-optimum scan flip-flops within the scan chains. For example, the outlier filtering tool 112 can move these non-optimum scan flip-flops to different scan chains than as provided by the ML DFT solution tool 106. Then, in the exemplary embodiment illustrated in FIG. 1, the design ECO tool 110 augments the one or more high-level software level descriptions of the electronic circuitry with the grouping and ordering of the scan flip-flops provided by the outlier filtering tool 112. Next, the placing and routing tool 104 augments the one or more electronic architectural design placements and/or the one or more electronic architectural design layouts in accordance with the grouping and ordering of the scan flip-flops provided by the outlier filtering tool 112 as described by the one or more high-level software level descriptions of the electronic circuitry provided by the design ECO tool 110. In an exemplary embodiment, the placing and routing tool 104 augments the one or more electronic architectural design placements for large size scan chains. Otherwise, in this exemplary embodiment, the placing and routing tool 104 augments the one or more electronic architectural design layouts for smaller size scan chains. In some situations, the synthesis tool 102 can augment the one or more high-level software level descriptions of the electronic circuitry in accordance with the grouping and ordering of the scan flip-flops provided by the outlier filtering tool 112.

The simulation tool 114 simulates the geometric shapes, the locations of the geometric shapes, and/or the interconnections between the geometric shapes as described by the one or more electronic architectural design layouts to replicate one or more characteristics, parameters, or attributes of the geometric shapes, the locations of the geometric shapes, and/or the interconnections between the geometric shapes. In an exemplary embodiment, the simulation tool 114 can provide a static timing analysis (STA), a voltage drop analysis, also referred to an IREM analysis, a Clock Domain Crossing Verification (CDC check), a formal verification, also referred to as model checking, equivalence checking, or any other suitable analysis that will be apparent to those skilled in the relevant art(s) without departing from the spirit and scope of the present disclosure. In another exemplary embodiment, the simulation tool 114 can perform an alternating current (AC) analysis, such as a linear small-signal frequency domain analysis, and/or a direct current (DC) analysis, such as a nonlinear quiescent point calculation or a sequence of nonlinear operating points calculated while sweeping a voltage, a current, and/or a parameter to perform the STA, the IREM analysis, or the other suitable analysis.

The verification tool 116 validates the one or more characteristics, parameters, or attributes of the geometric shapes, the locations of the geometric shapes, and/or the interconnections between the geometric shapes as replicated by the simulation tool 114 satisfy the electronic design specification. The verification tool 116 can also perform a physical verification, also referred to as a design rule check (DRC), to check whether the geometric shapes, the locations of the geometric shapes, and/or the interconnections between the geometric shapes assigned by the placing and routing tool 104 satisfies a series of recommended parameters, referred to as design rules, as defined by a semiconductor foundry and/or semiconductor technology node for manufacturing the electronic device.

Figure 2:
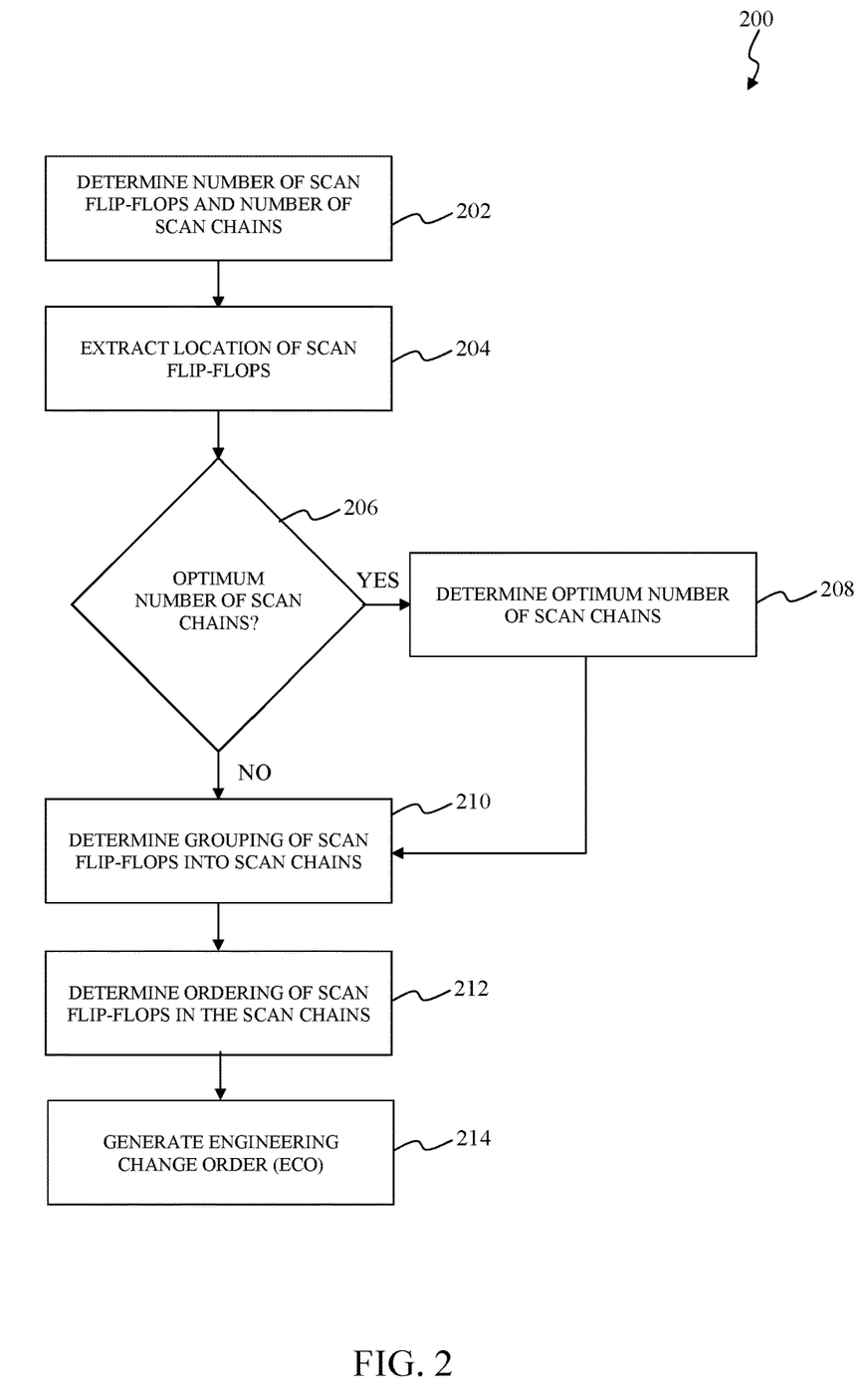
FIG. 2 illustrates a flowchart of an exemplary operation of the electronic design platform in grouping and/or ordering of scan flip-flops within scan chains according to an exemplary embodiment of the present disclosure.

Exemplary Grouping and/or Ordering of the Scan Flip-Flops within the Scan Chains FIG. 2 illustrates a flowchart of an exemplary operation of the electronic design platform in grouping and/or ordering of scan flip-flops within scan chains according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 200 to group and/or order the scan flip-flops within the scan chains within the electronic circuitry of the electronic device. In some situations, the exemplary operational control flow 200 can be iteratively repeated to optimize the grouping and/or the ordering of the scan flip-flops within the scan chains within the electronic circuitry of the electronic device. The operational control flow 200 can represent an exemplary operation for the machine learning (ML) design-for-test (DFT) solution tool 106 in determining the grouping and/or the ordering of the scan flip-flops within the scan chains as described above in FIG. 1.

At operation 202, the exemplary operational control flow 200 determines the number of scan flip-flops and the number of scan chains of the electronic circuitry. In an exemplary embodiment, the exemplary operational control flow 200 receives a scan chain report, such as a text file to provide an example, describing the scan chains. In this exemplary embodiment, the scan chain report represents an accounting of the number of scan chains of the electronic circuitry, a cumulative number of scan flip-flops within each of the scan chains, and/or a cumulative number of scan flip-flops within the electronic circuitry in its entirety. However, other mechanisms for determining the number of scan flip-flops and the number of scan chains of the electronic circuitry are possible, such as manual entry via a peripheral device, such as a keyboard, without departing from the spirit and scope of the present disclosure.

At operation 204, the exemplary operational control flow 200 extracts locations of the scan flip-flops within one or more electronic architectural design layouts. The one or more electronic architectural design layouts represent one or more images and/or one or more data-based representations of geometric shapes describing the electronic circuitry, locations of the geometric shapes, and/or interconnections between the geometric shapes. The one or more electronic architectural design layouts can represent one or more Design Exchange Format (DEF) files, one or more Library Exchange Format (LEF) files, one or more JPEG (Joint Photographic Experts Group) images, JPEG File Interchange Format (JIFF) images, Exchangeable image file (Exif) images, Tagged Image File Format (TIFF) images, Graphics Interchange Format (GIF) images, Windows bitmap (BMP) images, and/or Portable Network Graphic (PNG) images corresponding to the electronic circuitry and/or one or more Gerber data files, AutoCAD Drawing Exchange Format (DXF) data files, Portable Document Format (PDF) data files, Electronic Design Interchange Format (EDIF) data files, ODB++ data files, one or more Association Connecting Electronics Industries (IPC) data files, such as IPC-2511A, IPC-2511B, or IPC-2581 to provide some examples, one or more International Organization for Standardization (ISO) data files, such as ISO 10303-210 to provide an example, corresponding to the electronic circuitry.

At operation 206, the exemplary operational control flow 200 determines whether a number of the scan chains within the electronic circuitry is to be optimized. In some situations, the exemplary operational control flow 200 can autonomously determine to optimize the number of the scan chains within the electronic circuitry by evaluating power, performance, and/or area of the scan chains within the electronic circuitry from the one or more electronic architectural design layouts and comparing these power, performance, and/or area characteristics, parameters, or attributes of the scan chains to corresponding characteristics, parameters, or attributes for the power, the performance, and/or the area as outlined in an electronic design specification. In an exemplary embodiment, the exemplary operational control flow 200 can lessen the power, performance, and/or area of the scan chains within the electronic circuitry by optimizing the number of the scan chains within the electronic circuitry. In other situations, the grouping and/or the ordering of the scan flip-flops within the scan chains can be subject to the one or more electronic design constraints as described above in FIG. 1. In the exemplary embodiment illustrated in FIG. 2, the one or more electronic design constraints can include an indication that the number of the scan chains within the electronic circuitry is to be optimized. The operational control flow 200 proceeds to operation 208 to optimize the number of the scan chains within the electronic circuitry. Otherwise, the operational control flow 200 proceeds to operation 210 to determine the grouping of the scan flip-flops within the scan chains.

At operation 208, the exemplary operational control flow 200 determines an optimum number of scan chains for the electronic circuitry. The exemplary operational control flow 200 performs the mathematical cluster analysis of the scan flip-flops to group the scan flip-flops into the scan chains within the electronic circuitry as described above in FIG. 1. Thereafter, the exemplary operational control flow 200 performs a mathematical consistency analysis of the scan flip-flops, such as silhouette clustering to provide an example, to interpret and/or to validate consistency of the grouping of the scan flip-flops within the scan chains. In the exemplary embodiment illustrated in FIG. 2, the mathematical consistency analysis utilizes a distance metric, such as a Euclidean distance or a Manhattan distance to provide some examples, to determine distances between the scan flip-flops within the scan chains. The mathematical consistency analysis provides a consistency coefficient, such as a silhouette value to provide an example, representing a measure of similarity between the scan flip-flops within their own scan chains, referred to as cohesion, compared to scan flip-flops of other scan chains, referred to as separation. The exemplary operational control flow 200 iteratively repeats the mathematical cluster analysis to determine different groupings of the scan flip-flops into different number of scan chains and the mathematical consistency analysis to interpret and/or to validate consistency of these different groupings. Thereafter, the exemplary operational control flow 200 selects the number of scan chains having the largest consistency coefficient as the optimum number of scan chains for the electronic circuitry.

At operation 210, the exemplary operational control flow 200 performs k-means clustering to group the scan flip-flops into the number of scan chains determined from operation 208 or as identified in the scan chain report as described above in FIG. 1. The k-means clustering initializes random centroids within the electronic design real estate for the electronic circuitry. Each of these random centroids corresponds to one of the scan chains identified in the scan chain report. Thereafter, the k-means clustering assigns the scan flip-flops to the random centroids as also identified in the scan chain report. For example, the k-means clustering assigns each of the scan flip-flops to the random centroid having the nearest mean. Next, the k-means clustering determines new centroids for the scan chains from each of the previously assigned scan flip-flops within each of the scan chains. Thereafter, the k-means clustering assigns the scan flip-flops to these new centroids as also identified in the scan chain report. This process of determining new centroids for the scan chains and assigning the scan flip-flops to the new centroids is iteratively repeated until the k-means clustering assigns converges such that each scan flip-flop belongs to the scan chain having the nearest mean. In some situations, the grouping and/or the ordering of the scan flip-flops within the scan chains can be subject to one or more electronic design constraints as described above in FIG. 1. In these situations, the exemplary operational control flow 200 can further redistribute, based on closeness to the centroids, the grouping of the scan flip-flops within the scan chains as determined by the k-means clustering to generate approximately equal sized clusters for the scan chains to balance length of the scan chains.

At operation 212, the exemplary operational control flow 200 performs the travelling salesman problem (TSP) of the scan flip-flops within each of the scan chains to determine a routing order for the scan flip-flops as described above in FIG. 1. The TSP iteratively arranges a sequence or ordering for the scan flip-flops within each of the scan chains to optimize one or more routing parameters, such as wire length to provide an example, of the one or more electronic architectural design placements and/or the one or more electronic architectural design layouts to determine the routing order for the scan flip-flops. For example, the TSP can adjust the sequence of a scan chain to be a first sequence of a first scan flip-flop, a second scan flip-flop, and a third scan flip-flop from a second sequence of the first scan flip-flop, the third scan flip-flop, and the second scan flip-flop when the wire length of the first sequence is less than the wire length of the second sequence. The TSP continues to arrange the sequence or ordering for the scan flip-flops until the one or more routing parameters are optimized.

At operation 214, the exemplary operational control flow 200 generates an engineering change order (ECO) for the one or more electronic architectural design placements and/or the one or more electronic architectural design layouts. In an exemplary embodiment, the ECO represents a textual listing and/or a graphical representation of changes needed to the one or more electronic architectural design placements and/or the one or more electronic architectural design layouts to have the grouping and the ordering of the scan flip-flops within the one or more electronic architectural design placements and/or the one or more electronic architectural design layouts comply with the grouping and the ordering of the scan flip-flops as determined by operation 210 and operation 212.

Figure 3:
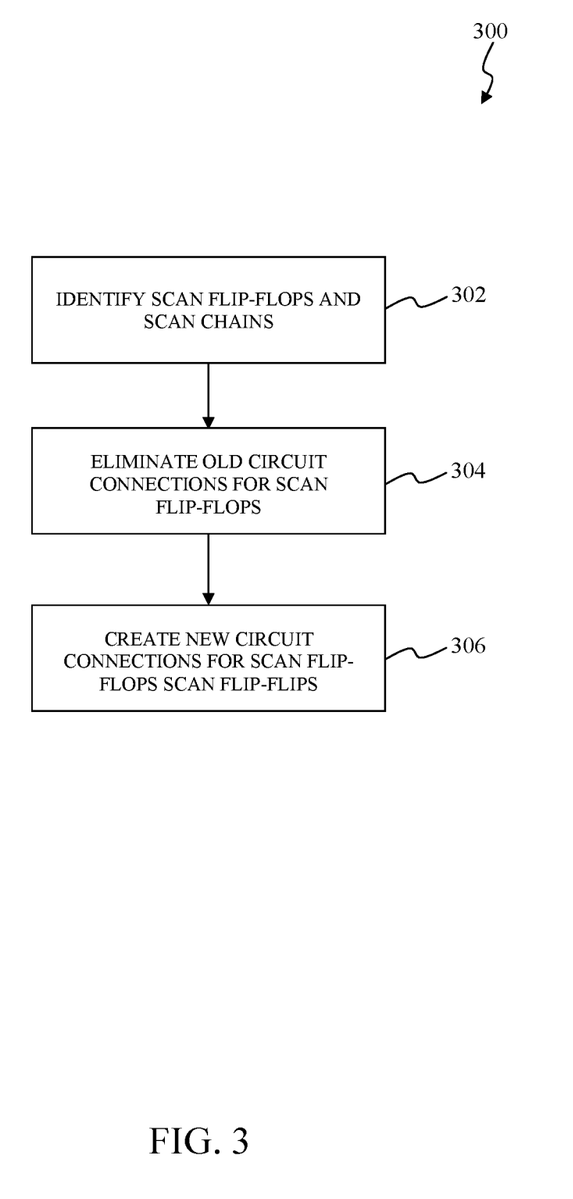
FIG. 3 illustrates a flowchart of an exemplary operation of the electronic design platform in generating high-level software level descriptions of scan flip-flops within scan chains according to an exemplary embodiment of the present disclosure.

Exemplary High-Level Software Level Descriptions of the Scan Flip-Flops within the Scan Chains FIG. 3 illustrates a flowchart of an exemplary operation of the electronic design platform in generating high-level software level descriptions of scan flip-flops within scan chains according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 300 to generate a high-level software level description of the scan flip-flops within the scan chains within the electronic circuitry of the electronic device. The operational control flow 300 can represent an exemplary operation for the design engineering change order (ECO) tool 110 in generating the one or more high-level software level descriptions of the electronic circuitry in accordance with the grouping and the ordering of the scan flip-flops provided by the ML DFT solution tool 106 as described above in FIG. 1 and/or the operational control flow 200 as described above in FIG. 2.

At operation 302, the operational control flow 300 identifies the scan flip-flops within the electronic circuitry of the electronic device. In the exemplary embodiment illustrated in FIG. 3, the operational control flow 300 identifies the scan flip-flops from the one or more high-level software level descriptions, the one or more electronic architectural design placements, and/or the one or more electronic architectural design layouts as described above in FIG. 1. In an exemplary embodiment, the one or more high-level software level descriptions, the one or more electronic architectural design placements, and/or the one or more electronic architectural design layouts can represent a textual representation of the electronic circuitry, such as a netlist; a high-level software model of the electronic circuitry using a high-level software language, such as a graphical design tool, for example C, System C, C++, LabVIEW, and/or MATLAB, a general purpose system design language, such as like SysML, SMDL and/or SSDL, or a high-level software format, such as Common Power Format (CPF), Unified Power Formant (UPF); or an image-based representation of the electronic circuitry, such as a computer-aided design (CAD) model to provide an example.

At operation 304, the operational control flow 300 eliminates circuit connections, referred to as old circuit connections, for the scan flip-flops identified in operation 302. Generally, the operational control flow 300 removes the ordering of scan flip-flops from the one or more high-level software level descriptions, the one or more electronic architectural design placements, and/or the one or more electronic architectural design layouts as described above in FIG. 1. In the exemplary embodiment illustrated in FIG. 3, the operational control flow 300 removes the grouping and ordering of the scan flip-flops identified in operation 302 within the one or more high-level software level descriptions of the electronic circuitry provided by the synthesis tool 102.

At operation 306, the operational control flow 300 creates new circuit connections for the scan flip-flops identified in operation 302 in the one or more high-level software level descriptions, the one or more electronic architectural design placements, and/or the one or more electronic architectural design layouts as described above in FIG. 1 in accordance with the grouping and/or the ordering of the scan flip-flops provided by the ML DFT solution tool 106 and/or the outlier filtering tool 112 as described above in FIG. 1 and/or the operational control flow 200 as described above in FIG. 2. In some situations, the operational control flow 300 can verify the new circuit connections for the scan flip-flops identified in operation 302. In an exemplary embodiment, the operational control flow 300 verifies the new circuit connections by tracing back the new circuit connections for the scan flip-flops identified in operation 302 from the one or more high-level software level descriptions, the one or more electronic architectural design placements, and/or the one or more electronic architectural design layouts.

Exemplary Filtering of Outlying Scan Flip-Flops within the Scan Chains

Figure 4:
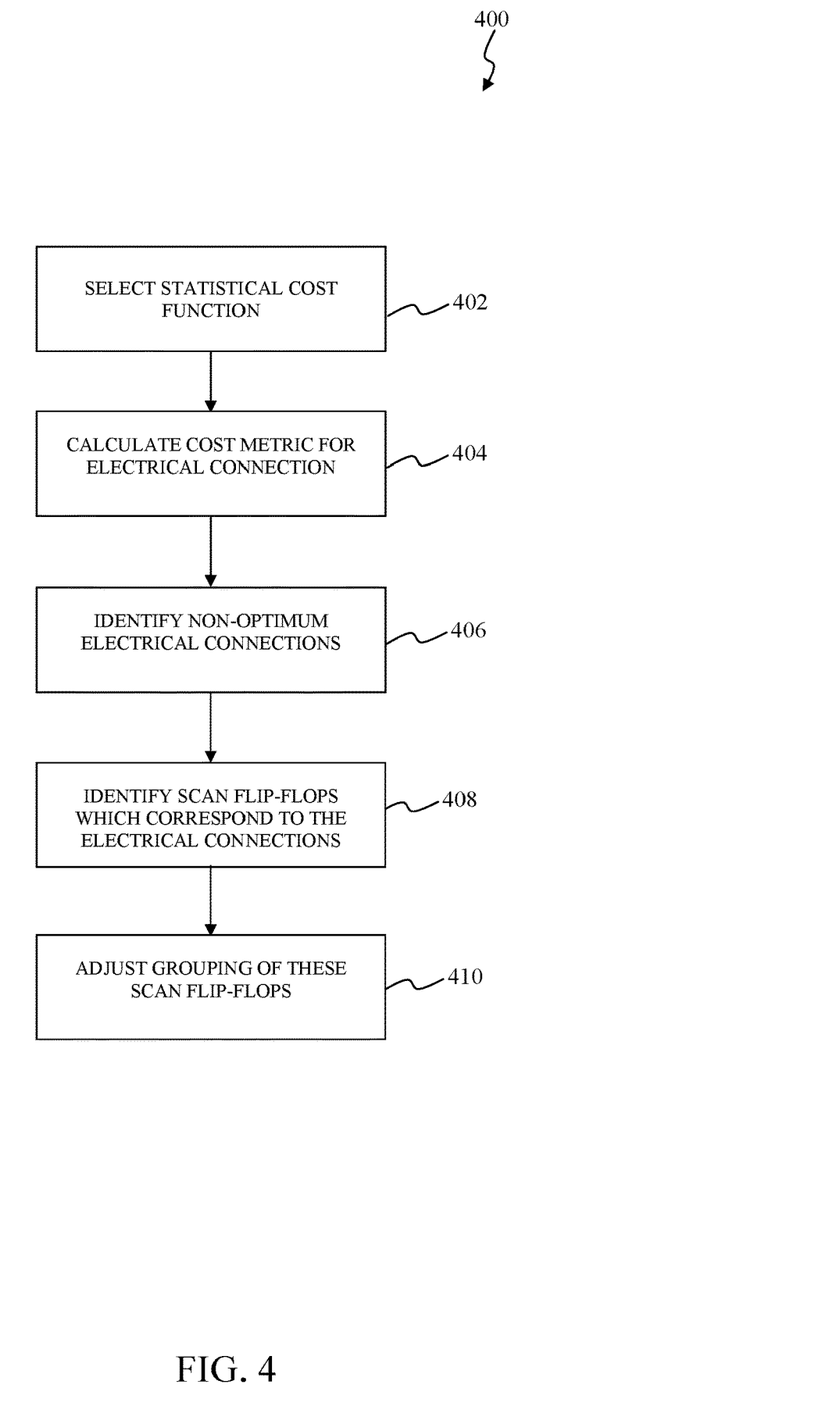
FIG. 4 illustrates a flowchart of an exemplary operation of the electronic design platform in filtering outlying scan flip-flops within the scan chains according to an exemplary embodiment of the present disclosure.

FIG. 4 illustrates a flowchart of an exemplary operation of the electronic design platform in filtering outlying scan flip-flops within the scan chains according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 400 to identify one or more non-optimum, referred to as outlier, the scan flip-flops within the scan chains within the electronic circuitry of the electronic device. The operational control flow 400 can represent an exemplary operation for the outlier filtering tool 112 in performing the statistical cost analysis of electrical connections between the scan flip-flops within the scan chains to identify the one or more non-optimum, referred to as outlier, scan flip-flops within the scan chains as described above in FIG. 1.

At operation 402, the operational control flow 400 selects a statistical cost function from among a L/D cost function, an M/D cost function, and/or an M/L cost function to provide some examples to evaluate electrical connections between the scan flip-flops within the scan chains to identify one or more non-optimum, referred to as outlier, scan flip-flops. In the exemplary embodiment illustrated in FIG. 4, the statistical cost function analyzes lengths (L) of scan wires between the scan flip-flops, distances (D) between the scan flip-flops, and number of metal layers (M) needed to manufacture the scan chains. The L/D cost function represents a ratio of a length (L) of a scan wire between scan flip-flops and a distance (D) between the scan flip-flops. The M/D cost function represents a ratio of the number of metal layers (M) needed to manufacture the scan chains and a distance (D) between scan flip-flops. The M/L cost function represents a ratio between the number of metal layers (M) needed to manufacture the scan chains and a length (L) of a scan wire between scan flip-flops.

At operation 404, the operational control flow 400 calculates a cost metric for the electrical connections between the scan flip-flops within the scan chains in accordance with the statistical cost function selected at operation 402. In the exemplary embodiment illustrated in FIG. 4, once the operational control flow 400 calculates the cost metrics for the electrical connections between the scan flip-flops within a first scan chain, the operational control flow 400 proceeds to calculate the cost metrics for electrical connections between the scan flip-flops within a second scan chain.

At operation 406, the operational control flow 400 identifies one or more non-optimum electrical connections between the scan flip-flops within the scan chains. In the exemplary embodiment illustrated in FIG. 4, the operational control flow 400 compares the cost metrics for the electrical connections to a cutoff threshold to identify the one or more non-optimum electrical connections between the scan flip-flops within the scan chains. In an exemplary embodiment, the cutoff threshold represents one or more standard deviations from the mean value of the cost metrics. For example, the cutoff threshold can represent two standard deviations, four standard deviations, or six standard deviations from the mean cost metric of the for the scan flip-flops. The operational control flow 400 identifies those electrical connections as being the one or more non-optimum electrical connections when their corresponding cost metric is greater than the cutoff threshold.

At operation 408, the operational control flow 400 identifies one or more scan flip-flops, referred to as non-optimum scan flip-flops, within the scan chains which correspond to the non-optimum electrical connections identified in operation 406. In the exemplary embodiment illustrated in FIG. 4, the operational control flow 400 identifies scan flip-flops, referred to as non-optimum scan flip-flops, within the scan chains which correspond, for example, are closest in distance, to the non-optimum electrical connections identified in operation 406 from the one or more electronic architectural design placements and/or the one or more electronic architectural design layouts. The operational control flow 400 can utilize a distance metric, such as a Euclidean distance or a Manhattan distance to provide some examples, to determine distances between the scan flip-flops within the scan chains and the non-optimum electrical connections.

At step 410, the operational control flow 400 adjusts the grouping of the scan flip-flops within the from the one or more electronic architectural design placements and/or the one or more electronic architectural design layouts. For example, the operational control flow 400 can group the non-optimum scan flip-flops identified in operation 408 in such a manner such that these non-optimum scan flip-flops share similar characteristics, parameters, or attributes as other scan flip-flops within their corresponding scan chains. The characteristics, parameters, or attributes can include distances between the scan flip-flops within the scan chains, density of the scan flip-flops within the scan chains, and/or statistical distributions, such as mean distances to provide an example, of the scan flip-flops within the scan chains.

Exemplary Computer System for Implementing the Exemplary Design Environment

Figure 5:
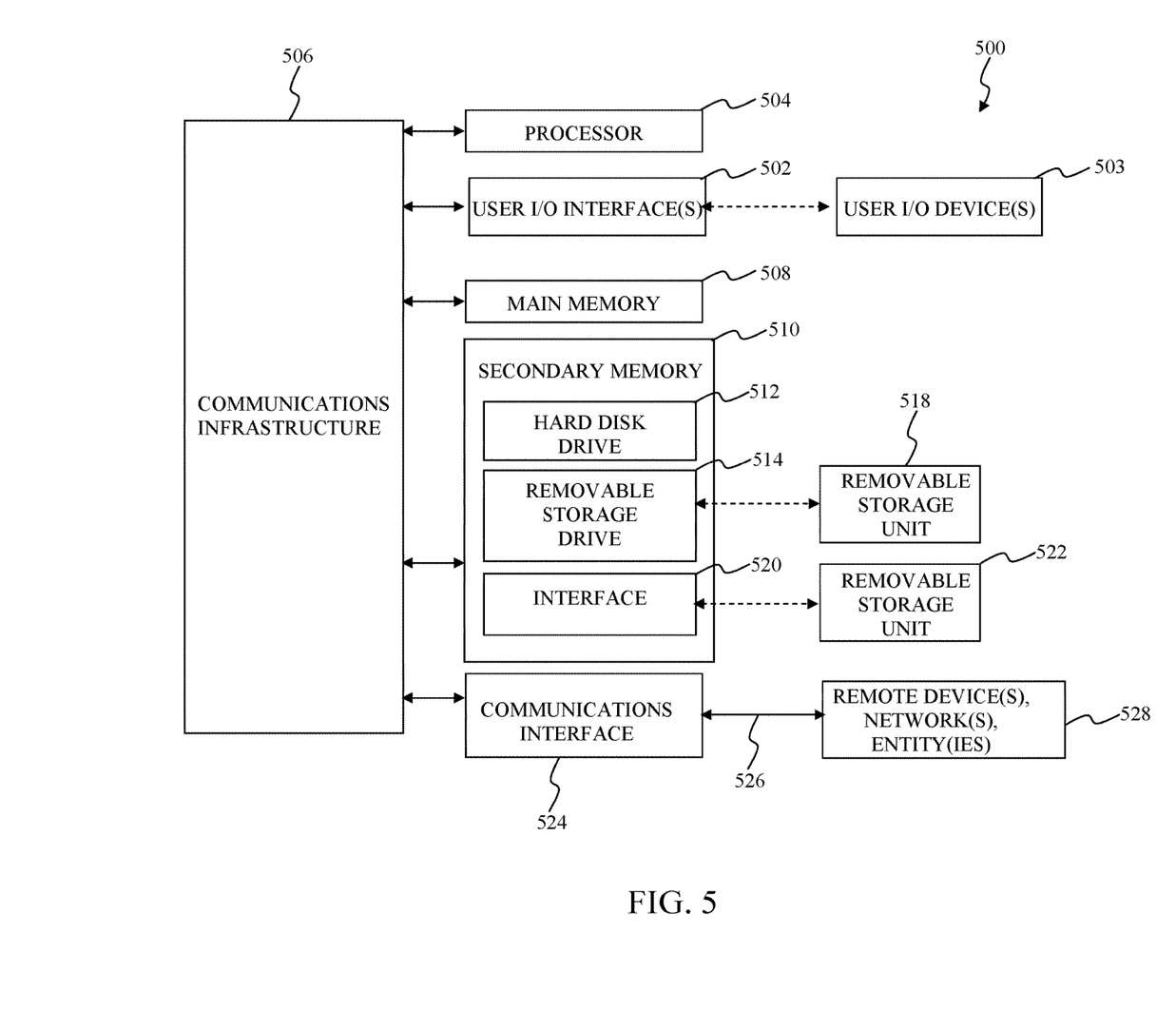
FIG. 5 illustrates a block diagram of an exemplary computer system for implementing the exemplary design environment according to an exemplary embodiment of the present disclosure.

FIG. 5 illustrates a block diagram of an exemplary computer system for implementing the exemplary design environment according to an exemplary embodiment of the present disclosure. A computer system 500 can be used to implement the electronic design platform 100 as described above in FIG. 1. However, in some situations, more than one computer system 500 can be used to electronic design platform 100. After reading this description, it will become apparent to a person skilled in the relevant art how to implement embodiments using other computer systems and/or computer architectures.

The computer system 500 includes one or more processors 504, also referred to as central processing units, or CPUs, to execute the synthesis tool 102, the placing and routing tool 104, the machine learning (ML) design-for-test (DFT) solution tool 106, the DFT specification tool 108, the design engineering change order (ECO) tool 110, the outlier filtering tool 112, the simulation tool 114, and/or the verification tool 116 as described above in FIG. 1. The one or more processors 504 can be connected to a communication infrastructure or bus 506. In an exemplary embodiment, one or more of the one or more processors 504 can be implemented as a graphics processing unit (GPU). The GPU represents a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

The computer system 500 also includes user input/output device(s) 503, such as monitors, keyboards, pointing devices, etc., which communicate with communication infrastructure 506 through user input/output interface(s) 502.

The computer system 500 also includes a main or primary memory 508, such as a random-access memory (RAM) to provide an example. The main memory 508 can include one or more levels of cache. The main memory 508 has stored therein control logic (i.e., computer software) and/or data, such as the synthesis tool 102, the placing and routing tool 104, the machine learning (ML) design-for-test (DFT) solution tool 106, the DFT specification tool 108, the design engineering change order (ECO) tool 110, the outlier filtering tool 112, the simulation tool 114, and/or the verification tool 116.

The computer system 500 can also include one or more secondary storage devices or memory 510 to store the synthesis tool 102, the placing and routing tool 104, the machine learning (ML) design-for-test (DFT) solution tool 106, the DFT specification tool 108, the design engineering change order (ECO) tool 110, the outlier filtering tool 112, the simulation tool 114, and/or the verification tool 116. The one or more secondary storage devices or memory 510 can include, for example, a hard disk drive 512 and/or a removable storage device or drive 514. The removable storage drive 514 may be a floppy disk drive, a magnetic tape drive, a compact disk drive, an optical storage device, tape backup device, and/or any other storage device/drive. The removable storage drive 514 may interact with a removable storage unit 518. The removable storage unit 518 includes a computer usable or readable storage device having stored thereon computer software (control logic) and/or data. The removable storage unit 518 may be a floppy disk, magnetic tape, compact disk, DVD, optical storage disk, and/any other computer data storage device. The removable storage drive 514 reads from and/or writes to removable storage unit 518 in a well-known manner.

According to an exemplary embodiment, the one or more secondary storage devices or memory 510 may include other means, instrumentalities or other approaches for allowing computer programs and/or other instructions and/or data to be accessed by computer system 500. Such means, instrumentalities or other approaches may include, for example, a removable storage unit 522 and an interface 520. Examples of the removable storage unit 522 and the interface 520 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

The computer system 500 may further include a communication or network interface 524. The communication or network interface 524 enables the computer system 500 to communicate and interact with any combination of remote devices, remote networks, remote entities, etc. (individually and collectively referenced by reference number 528). For example, the communication or network interface 524 may allow the computer system 500 to communicate with the remote devices 528 over a communications path 526, which may be wired and/or wireless, and which may include any combination of LANs, WANs, the Internet, etc. Control logic and/or data may be transmitted to and from the computer system 500 via communication path 526.

In an embodiment, a tangible apparatus or article of manufacture comprising a tangible computer useable or readable medium having control logic (software) stored thereon is also referred to herein as a computer program product or program storage device. This includes, but is not limited to, the computer system 500, the main memory 508, the secondary memory 510, and the removable storage units 518 and 522, as well as tangible articles of manufacture embodying any combination of the foregoing. Such control logic, that when executed by one or more data processing devices (such as computer system 500), causes such data processing devices to operate as described herein.

Based on the teachings contained in this disclosure, it will be apparent to persons skilled in the relevant art(s) how to make and use the disclosure using data processing devices, computer systems and/or computer architectures other than that shown in FIG. 5. In particular, embodiments may operate with software, hardware, and/or operating system implementations other than those described herein.

CONCLUSION

The foregoing Detailed Description discloses a computer system for grouping and ordering a scan flip-flops within electronic circuitry of an electronic device. The computer system includes a memory and a processor. The memory stores one or more instructions. The processor executes the one or more instructions, the one or more instructions, when executed by the processor, configuring the processor to: perform a cluster analysis of the scan flip-flops to group the scan flip-flops into a scan chains; and perform a routing analysis of scan flip-flops within each scan chain to determine routing orders for the scan flip-flops.

The foregoing Detailed Description additionally discloses a computer system for optimizing a grouping of scan flip-flops into scan chains within electronic circuitry of an electronic device. The computer system includes a memory and a processor. The memory stores one or more instructions. The processor executes the one or more instructions, the one or more instructions, when executed by the processor, configuring the processor to: perform a statistical cost analysis of characteristics, parameters, or attributes of electrical connections between the scan flip-flops to identify an non-optimum electrical connection from among the electrical connections; identify a scan flip-flop from the scan flip-flops corresponding to the non-optimum electrical connection, the scan flip-flop being from among a first group of scan flip-flops from among the scan flip-flips that are grouped to form a first scan chain from among the scan chains; move the scan flip-flop from the first group of scan flip-flops to a second group of scan flip-flops from among the scan flip-flips that are grouped to form a second scan chain from among the scan chains.

The foregoing Detailed Description further discloses a method for grouping and ordering scan flip-flops within electronic circuitry of an electronic device. The method includes: performing a cluster analysis of the scan flip-flops to group the scan flip-flops into scan chains; performing a routing analysis of scan flip-flops within each scan chain from among scan chains to determine electrical connections for the scan flip-flops; performing a statistical cost analysis of characteristics, parameters, or attributes of the electrical connections between the scan flip-flops to identify an non-optimum electrical connection from among the electrical connections; identifying a scan flip-flop from among the scan flip-flops corresponding to the non-optimum electrical connection, the scan flip-flop being from among a first group of scan flip-flops from among the scan flip-flips that are grouped to form a first scan chain from among the scan chains; and moving the scan flip-flop from the first group of scan flip-flops to a second group of scan flip-flops from among the scan flip-flips that are grouped to form a second scan chain from among the scan chains.

The foregoing Detailed Description outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A computer system for grouping and ordering a plurality of scan flip-flops within electronic circuitry of an electronic device, the computer system comprising:
    a memory that stores one or more instructions; and
    a processor configured to execute the one or more instructions, the one or more instructions, when executed by the processor, configuring the processor to:
        group the plurality of scan flip-flops into a first plurality of scan chains having a first number of scan chains based upon a first cluster analysis of the plurality of scan flip-flops and a second plurality of scan chains having a second number of scan chains based upon a second cluster analysis of the plurality of scan flip-flops;
        determine a first consistency coefficient representing a measure of a similarity between scan flip-flops within each scan chain from among the first plurality of scan chains compared to scan flip-flops of other scan chains from among the first plurality of scan chains and a second consistency coefficient representing a measure of a similarity between scan flip-flops within each scan chain from among the second plurality of scan chains compared to scan flip-flops of other scan chains from among the second plurality of scan chains;
        select the first number of scan chains to be an optimum number of scan chains for the electronic circuitry when the first consistency coefficient is larger than the second consistency coefficient or the second number of scan chains to be the optimum number of scan chains for the electronic circuitry when the second consistency coefficient is larger than the first consistency coefficient;
        group the plurality of scan flip-flops into the optimum number of scan chains based upon centroid-based clustering of the plurality of scan flip-flops; and
        determine a plurality of routing orders for the plurality of scan flip-flops based upon a routing analysis of scan flip-flops within each scan chain from among the optimum number of scan chains.

2. The computer system of claim 1, wherein the one or more instructions, when executed by the processor, further configure the processor to extract a plurality of locations of the plurality of scan flip-flops from an electronic architectural design placement for the electronic circuitry or an electronic architectural design layout of the electronic circuitry.

3. The computer system of claim 1, wherein the first cluster analysis is configured to group the plurality of scan flip-flops in such a manner that scan flip-flops within each scan chain from among the first plurality of scan chains share similar characteristics, parameters, or attributes when compared to characteristics, parameters, or attributes of scan flip-flops within other scan chains from among the first plurality of scan chains.

4. The computer system of claim 3, wherein the characteristics, parameters, or attributes comprise:
    a plurality of distances between the plurality of scan flip-flops within the first plurality of scan chains;
    a plurality of densities of the scan flip-flops within the plurality of scan flip-flops within the first plurality of scan chains, or
    a plurality of statistical distributions of the scan flip-flops within the first plurality of scan flip-flops within the plurality of scan chains.

5. The computer system of claim 1, wherein the first cluster analysis comprises:
    a connectivity-based clustering;
    the centroid-based clustering;
    a distribution-based clustering; or
    a density-based clustering.

6. The computer system of claim 1, wherein the routing analysis comprises a shortest path problem.

7. The computer system of claim 1, wherein the routing analysis is configured to arrange an ordering for scan flip-flops within each scan chain from among the optimum number of scan chains to optimize one or more routing parameters for each scan chain from among the optimum number of scan chains.

8. The computer system of claim 7, wherein the one or more routing parameters comprises:
    a wire length between scan flip-flops within each scan chain from among the optimum number of scan chains.

9. The computer system of claim 1, wherein the one or more instructions, when executed by the processor, further configure the processor to provide a scan cluster report describing grouping of the plurality of scan flip-flops into the optimum number of scan chains and routing orders for the plurality of scan flip-flops within each scan chain from among the optimum number of scan chains.

10. A computer system for optimizing a grouping of a plurality of scan flip-flops into a plurality of scan chains within electronic circuitry of an electronic device, the computer system comprising:
    a memory that stores one or more instructions; and a processor configured to execute the one or more instructions, the one or more instructions, when executed by the processor, configuring the processor to:
    perform a statistical cost analysis of a plurality of characteristics, parameters, or attributes of a plurality of electrical connections between the plurality of scan flip-flops to identify a non-optimum electrical connection from among the plurality of electrical connections;
    identify a scan flip-flop from among the plurality of scan flip-flops corresponding to the non-optimum electrical connection, the identified scan flip-flop being from among a first group of scan flip-flops from among the plurality of scan flip-flips that are grouped to form a first scan chain from among the plurality of scan chains; and
    move the identified scan flip-flop from the first group of scan flip-flops to a second group of scan flip-flops from among the plurality of scan flip-flips that are grouped to form a second scan chain from among the plurality of scan chains.

11. The computer system of claim 10, wherein the plurality of characteristics, parameters, or attributes of the plurality of electrical connections comprises:
    a plurality of lengths (L) of a plurality of scan wires between the plurality of scan flip-flops;
    a plurality of distances (D) between the plurality of scan flip-flops, or
    a number of metal layers (M) needed to manufacture the plurality of scan chains.

12. The computer system of claim 11, wherein the statistical cost analysis comprises:
    an L/D cost analysis,
    an M/D cost analysis, or
    an M/L cost analysis.

13. The computer system of claim 10, wherein the one or more instructions, when executed by the processor, configure the processor to compare the statistical cost analysis of the plurality of characteristics, parameters, or attributes to a cutoff threshold and to identify the non-optimum electrical connection whose statistical cost analysis is greater than or equal to the cutoff threshold.

14. The computer system of claim 13, wherein the cutoff threshold corresponds to one or more standard deviations from a mean value of the statistical cost analysis of the plurality of characteristics, parameters, or attributes.

15. The computer system of claim 10, wherein the one or more instructions, when executed by the processor, further configure the processor to receive an electronic architectural design placement for the plurality of scan flip-flops, the electronic architectural design placement representing a logical placement of the plurality of scan flip-flops onto an electronic design real estate.

16. A method for grouping and ordering a plurality of scan flip-flops within electronic circuitry of an electronic device, the method comprising:
    performing a cluster analysis of the plurality of scan flip-flops to group the plurality of scan flip-flops into a plurality of scan chains;
    performing a routing analysis of scan flip-flops within each scan chain from among the plurality of scan chains to determine a plurality of electrical connections for the plurality of scan flip-flops;
    performing a statistical cost analysis of a plurality of characteristics, parameters, or attributes of the plurality of electrical connections between the plurality of scan flip-flops to identify a non-optimum electrical connection from among the plurality of electrical connections;
    identifying a scan flip-flop from among the plurality of scan flip-flops corresponding to the non-optimum electrical connection, the identified scan flip-flop being from among a first group of scan flip-flops from among the plurality of scan flip-flips that are grouped to form a first scan chain from among the plurality of scan chains; and
    moving the identified scan flip-flop from the first group of scan flip-flops to a second group of scan flip-flops from among the plurality of scan flip-flips that are grouped to form a second scan chain from among the plurality of scan chains.

17. The method of claim 16, wherein the performing the cluster analysis comprises:
    grouping the plurality of scan flip-flops in such a manner that scan flip-flops within each scan chain from among the plurality of scan chains share similar characteristics, parameters, or attributes when compared to characteristics, parameters, or attributes of scan flip-flops within other scan chains from among the plurality of scan chains.

18. The method of claim 16, wherein the performing the routing analysis comprises:
    arranging an ordering for scan flip-flops within each scan chain from among the plurality of scan chains to optimize one or more routing parameters for each scan chain from among the plurality of scan chains.

19. The method of claim 16, wherein the identifying comprises:
    comparing the statistical cost analysis of the plurality of characteristics, parameters, or attributes to a cutoff threshold; and
    identifying the non-optimum electrical connection whose statistical cost analysis is greater than or equal to the cutoff threshold.

\* \* \* \* \*